(12) United States Patent
Fischer

(10) Patent No.: US 10,353,363 B1
(45) Date of Patent: Jul. 16, 2019

(54) FUNCTION RECEIVE BLOCK, FUNCTION SEND BLOCK, AND COMPUTER-IMPLEMENTED METHOD FOR COMPUTER-AIDED GENERATION OF AN EXECUTABLE CONTROL PROGRAM

(71) Applicant: dSPACE digital signal processing and control engineering GmbH, Paderborn (DE)

(72) Inventor: Karsten Fischer, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 289 days.

(21) Appl. No.: 15/339,968

(22) Filed: Nov. 1, 2016

Related U.S. Application Data

(60) Provisional application No. 62/253,942, filed on Nov. 11, 2015.

(51) Int. Cl.
*G05B 17/02* (2006.01)
*G06F 8/35* (2018.01)

(52) U.S. Cl.
CPC ............... *G05B 17/02* (2013.01); *G06F 8/35* (2013.01)

(58) Field of Classification Search
CPC ...................................................... G05B 17/02
See application file for complete search history.

(56) References Cited

U.S. PATENT DOCUMENTS 7,324,931 B1    1/2008  Warlock
7,412,367 B1    8/2008  Warlock et al.

OTHER PUBLICATIONS

Wolff, Hans-Joerg, "Aspekte der Offenheit von Entwicklungswerkzeugen", KFZ-Elektronic, electronik industrie 5, pgs. 36-35 (2009).
"Call Simulink or Stateflow function", Simulink—MathWorks Deutschland, http://www.mathworks.de/help/simulink/slref/funtioncaller.html, pp. 1-2, Germany (Oct. 17, 2014).
"Wolfram System Modeler User Guide—Model Center", Wolfram Research, Inc., 82 pages, (2012).

*Primary Examiner* — Yu-Hsi D Sun
(74) *Attorney, Agent, or Firm* — Muncy, Geissler, Olds & Lowe, P.C.

(57) ABSTRACT

A system composed of a function receive block and a function send block for a graphical, block-based modeling environment for graphical modeling of technical and mathematical relationships with a block diagram. Blocks of the block diagram have input ports and/or output ports, wherein the blocks can be connected through their ports by signal lines for data transmission. Especially flexible management of a functionality to be implemented is achieved in that the function receive block has a function receive port through which the function receive block can be assigned a functionality and only the interfaces of the assignable functionality are specified in the function receive block in the form of the number of inputs and/or the number of outputs of the functionality. The function send block has a function send port through which a functionality is sent out to an associated function receive block.

18 Claims, 10 Drawing Sheets

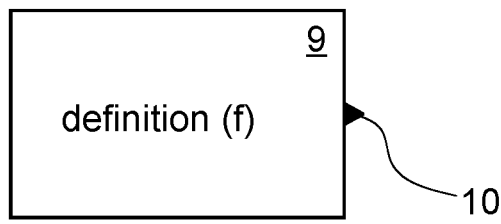
Fig. 2A
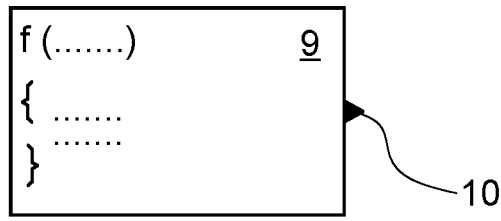
Fig. 2B
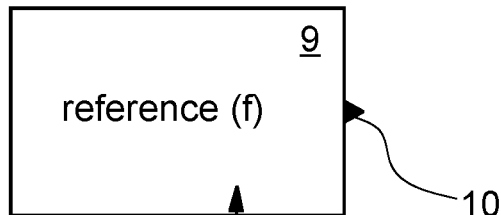
Fig. 2C
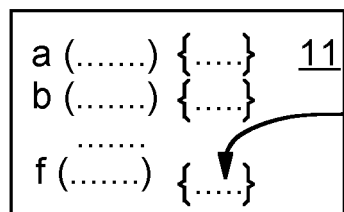

Simplified pseudocode
======================

Module_C:
---------
in *f1, *f2

// calculate out using two input functions
out = C(*f1,*f2)
{
   // select f by switch
   if(...) f = f1, else f = f2;
   // evaluate f and then calculate addition with its result
   out = (f!) + ...;
}

Module_I:
---------
using modules A,B,C
in x, y
out r

I()
{
   // calculate overall result
   r = C(=>A(x), =>B(y));
}

Fig. 8

FUNCTION RECEIVE BLOCK, FUNCTION SEND BLOCK, AND COMPUTER-IMPLEMENTED METHOD FOR COMPUTER-AIDED GENERATION OF AN EXECUTABLE CONTROL PROGRAM

This nonprovisional application claims priority to U.S. Provisional Application No. 62/253,942, which was filed on Nov. 11, 2015, and is herein incorporated by reference.

BACKGROUND OF THE INVENTION

Field of the Invention

The invention relates to a function receive block for a graphical, block-based modeling environment for graphical modeling of technical and mathematical relationships with a block diagram, wherein the blocks of the block diagram have input ports and/or output ports, wherein the blocks can be connected through their ports by signal lines for data transmission. In addition, the invention also relates to a function send block for a graphical, block-based modeling environment for graphical modeling of technical and mathematical relationships with a block diagram, wherein the blocks of the block diagram have input ports and/or output ports, wherein the blocks can be connected through their ports by signal lines for data transmission. In connection with the function receive block and the function send block, the invention furthermore also relates to a computer-implemented method for computer-aided generation of an executable control program for controlling a control system with an electronic computing unit, wherein the functionality of the control program is at least partially described in a graphical, block-based model, and the graphical model includes at least one aforementioned function receive block and one aforementioned function send block.

Description of the Background Art

Graphical, block-based modeling of technical and mathematical relationships with a block diagram has for decades been part of the standard repertoire in the field of research using control systems, but especially in the technical development of control systems, and is used intensively in the automotive field, in the aerospace industry, and in other technical and industrial application areas as well, for example. The control systems are generally control units, which is to say small computers with an electronic computing unit, on which a real-time operating system is usually run. Control systems in the form of control units typically have a variety of I/O interfaces through which the control unit is connected with a physical technical process that is to be influenced, from which measured process variables are thus to be acquired, and that is acted upon by the output of control variables. Accordingly, the external interface to the process includes sensors and actuators.

Description of the functionality of control programs with the aid of graphical models has been known for many years. The block-based models are generally described in the form of block diagrams such as are known from system theory. A signal flow between the various blocks of a block diagram is specified here using signal lines, wherein the blocks contain a particular transfer functionality between their inputs and outputs, and the incoming signals are numerically subjected to this functionality. Graphical models of this type frequently comprise sub-models (as subsystems or independent models) for hierarchical structuring, which in the case of block diagrams often have, in turn, the appearance of a block in which the sub-functionality of the sub-model is defined at a finer level of granularity using elementary blocks. One example of an established development environment for building block-based mathematical models is MATLAB and Simulink from The MathWorks, Inc.

The use of graphical models for describing the functionality of the control program has the particular advantage that the modeling is relatively clear and intuitive. Above all, the subsequent automated translation of the graphical model or the block diagram into code in a high-level programming language entails the advantage that error-prone manual programming/conversion of the modeled functionality into a high-level programming language is eliminated, and content-related adaptations of the functionality of the control program can be made, tested on the control system, and subsequently manufactured in production considerably more quickly.

To this end, the code in a high-level programming language that is generated from the graphical model is generally compiled into an executable program for the computing unit of the control system by a compiler of the high-level programming language. However, it could also be executed on the control system by an interpreter or serve as input for generating a circuit for the controller (hard-wired or for a Field Programmable Gate Array (FPGA)).

The executable control program is then loaded onto the control system, where it is executed—typically in real time—on the electronic computing unit. On the control system, the control program implements a sampled-data system in the automatic control sense that is connected with the associated physical technical process in a fixed time interval or even using multiple time intervals/sampling times.

It is known in the prior art for functionalities within a block of the block diagram to be referenced, for example by block-based subsystems. However, the functionality is then statically defined within the block, which involves various disadvantages. For example, different variants of the functionality should already be modeled in the model or in the block, which is very inflexible when the functionality is to be modified or a variant of the functionality is to be changed.

SUMMARY OF THE INVENTION

It is therefore an object of the present invention to provide, in the framework of graphical modeling and the generation of an executable control program based on the graphical, block-based model, a possibility to allow more flexible management and modeling of functionalities in blocks.

In an exemplary embodiment, a system is provided composed of a function receive block and a corresponding function send block for a graphical, block-based modeling environment, and also by a computer-implemented method using the aforementioned function receive blocks and function send blocks, with the aid of which the executable control program of interest for controlling a control system that is connected to a physical technical process is ultimately generated.

The function receive block according to an embodiment of the invention can have at least one function receive port, through which the function receive block can be assigned a functionality, and wherein only the interfaces of the assignable functionality are specified in the function receive block in the form of the number of inputs and/or the number of outputs of the functionality. Here inputs and outputs can be, for example, input signals and output signals on the block diagram level or corresponding input variables and output variables on the code level respectively. Both of which then in turn may also directly represent input variables and output variables of the physical control system with the electronic control unit.

The function receive block according to an embodiment of the invention has the advantage that the concrete functionality need not be stored in the block itself, but instead the block only needs to have information about general features of the assignable functionality, namely the number of inputs and/or the number of outputs of the functionality, which are critical pieces of information about the assignable functionality. In particular, it is not necessary for the name of the assignable functionality or the functionality itself, for example, to be known to the function receive block. The function receive block can of course also have other input ports and/or output ports of "conventional" design, which thus are only suitable for receiving data—or even complex data structures—and processing the data using a functionality stored in the block. Due to its function receive port, the function receive block is thus capable of receiving an external functionality with via a block diagram—namely a port. As a result, it is in particular no longer necessary for the desired functionality to be stored in the block itself. According to an embodiment of the invention, the functionality itself, which is to say the algorithm that constitutes the functionality, should not be stored in the function receive block.

The representation of a function receive port and of signal lines for connecting the port need not differ from that of a conventional port or a conventional line. What is important is its suitability for assignment of a functionality that has the interfaces that are expected of the function receive block by definition. A port of a block in a block diagram can be specified permanently to a function receive port, for example, through fixed configuration of the interfaces of a block from a predefined library or through appropriate specification by the user. However, the function receive block can also have omnipotent ports, which only become either a "conventional" port for receiving data or a function receive port for receiving functional signals as a function of the type of signal that is applied.

In an embodiment of the function receive block, provision is made that the definition of the interfaces of the assignable functionality also includes the type of the inputs and/or of the outputs. The type of the inputs or outputs can be, for example, the data types of the input signals and output signals or input variables or output variables for the code generation respectively. These do not have to be just elementary data types—such as Boolean, integer, or double, for example—they can also be arbitrarily complex, structured data types, self-defined data types, or, e.g., complex predefined data types, such as the messages of a bus protocol.

The function send block can have a number of input ports and/or output ports corresponding to the definition of the interfaces of the assignable functionality. This ensures that the function receive block immediately receives the corresponding input signals of the assigned functionality through the input ports and can output a corresponding number of output signals through the output ports. Provision is made in particular that, after definition of the interfaces of the assignable functionality has taken place, the modeling environment automatically equips the function receive block with a corresponding number of input ports and/or output ports, without any additional action being required here on the part of the user.

As a result of the fact that the interfaces of the assignable functionality are specified in the function receive block, it is readily possible according to an advantageous embodiment of the invention that appropriate code, in particular a corresponding function call that suitably reflects the definition of the interfaces, is generated for the function receive block with the aid of the definition of the interfaces of the assignable functionality. It is thus not necessary for a functionality, which is to say an algorithmic function content, to have already been assigned to the function receive block, in order to generate a function call for the function receive block that satisfies all programming requirements, for example. This produces the advantage that sub-models can more easily be divided into independent model parts, and the code part generated in each case is itself invariant with respect to variants of the received or called functionality and need not be generated again when the functionality is changed, saving generation time as well as time for (repeated) code reviews of the code.

In an exemplary embodiment of the invention, provision is made, especially when the function receive block is already receiving all inputs of the functionality to be received through corresponding input ports, for the function receive block to itself use the assigned functionality, whether as part of an offline simulation—on a simulation computer, generally within the framework of the modeling environment—or within the framework of generated code in a high-level programming language that is generated for the corresponding function receive block. This is closely related to an embodiment of the function receive block in which the functionality assigned through the function receive port is executed by the function receive block itself or is code-generated for the function receive block itself. The first case again concerns the offline simulation, in which the block diagram generally is calculated, not in real time, on a simulation computer within the framework of the modeling environment. Here, a processing sequence of the blocks of the block diagram is defined by the signal flow specified in the block diagram. For the case in which the function receive block itself uses the received functionality, this received functionality is calculated separately at the processing point defined by the position of the function receive block in the signal flow. The second variant concerns the application case in which the block diagram is translated into a high-level programming language and ultimately into an executable control program for a control system. Here, it is ensured during the code generation that appropriate code for implementing the received functionality is generated at the point defined by the position of the function receive block in the signal flow, which is to say, for example, a suitable function call—wherein the function can be defined at a different point by software—or even by implementing the complete functionality at the corresponding position (inline implementation of the received functionality).

Provision is also made in an embodiment for the functionality assigned through the function receive port to be sent out again by the function receive block through a function send port. The function receive block essentially forwards the functionality assigned to it. In this case, the function receive block itself is not the place where the assigned functionality is used, i.e. calculated, but instead the function receive block passes the received functionality on through the function send port. This allows extensive possibilities for optimization in the later calculation of the block diagram, regardless of whether the block diagram is calculated within the framework of an offline simulation or whether the block diagram is translated into highly optimized program code in a high-level language. In this context, it has proven most especially advantageous in an enhancement for the functionality sent out from the function receive block through the function send port to be concatenated with a functionality implemented in a fixed manner in the function receive block, and thus the complete functionality of the function receive block is sent. In other words, the evaluation or calculation of the functionality can then be moved to a favorable point in time (position in the code), which either is specified ("forced") by the user or preferably can be decided by the code generator.

The functional counterpart of the function receive block described above is the function send block mentioned at the outset, which is distinguished in that it has a function send port through which a functionality is sent, wherein the functionality sent through the function send port is specified in the function send block. In contrast to the function receive block, the function send block includes all the information about the sent functionality, which is to say also the function content, the algorithm on which the functionality is based. In an exemplary embodiment, provision is made that the definition of the sent functionality includes the name of the functionality, the interfaces of the functionality, preferably at least one argument of the functionality, and especially preferably the functionality itself. The interfaces of the functionality are then present, for example in the form of the number of inputs and/or the number of outputs of the functionality, depending on whether the functionality works with inputs and/or generates outputs. The 'functionality itself' can mean the content of the functionality, which is to say, for example, a calculation rule constituting the functionality, or very generally, the algorithm constituting the functionality. Moreover, supplementary information about settings for code generation may be present, for example the code module in which the functionality of a (sub-)model should be placed or which code variables should represent the inputs and outputs of the functionality. This applies in general to model-based code generation and specifically also to the function receive block (as a sub-model).

In the prior art, large models are thus subdivided into smaller code generation units, among other things benefiting the clarity and reusability of such sub-model units and code units. Based on the term 'sub-model', it is additionally obvious that there is generally a higher-level model, which may be composed of reused sub-models and then combines them into a complete functionality. Such a higher-level model is then called an integrated model. Because sub-model and model are derived from the hierarchical approach, yet each of these can in turn be complete models within themselves, an integrated model itself can also be used as a sub-model of a still higher-level integrated model. Thus, in current practice complex models are constructed from reusable units, which can be accomplished in Matlab/Simulink, for example, with so-called model libraries and referenced models. In this context, it is desirable to also be able to reuse the code of the subunits, and thus for integration at the code level the previously generated code of sub-models is re-used unchanged, and only connecting integration code (called glue code) is generated that reflects the aforementioned integrative connection of the sub-models in their codes, thus constructing its own code function.

If one and the same sub-model is contained multiple times in an integrated model, then in the prior art the same code function of the sub-model can also be reused, which corresponds to multiple calls of the associated sub-function in the integration code. When applied to our case, this means that this method can likewise be used when there are multiple recipients of a sent functionality in the integrated model, for example through branchings of the signal line going out from the sending entity.

In an exemplary embodiment of the function send block, provision is additionally made that the definition of the sent functionality includes a reference to a functionality stored outside of the function send block. The name of the functionality, the interfaces of the functionality, and the functionality itself are retrievable through this reference to the functionality. The functionality can be contained in a function library, for example. The two measures described above, namely that the functionality is contained practically in its entirety in the function send block and that the functionality is not contained in its entirety in the function send block, but instead is retrievable through reference to another location, should not be understood as mutually exclusive alternatives: the two measures can also be implemented simultaneously in a function send block. A first functionality of the function send block could then be contained in its entirety in the function send block, while a second functionality of the function send block could be retrievable through a reference in the corresponding definition. What is important is that the function send block has access to the requisite data processing description of the functionality.

In an embodiment of the function send block, the functionality can be sent through the function send port if the calculation of the block diagram is started from within a modeling environment or if a code generation process for the block diagram is started from within a code generator. This is advantageous because the block diagram is in a final state at the time of the intended start of the calculation of the block diagram or at the time of the intended start of the code generation for the block diagram, which is to say that the block diagram will not experience any more changes for the time being. At this time, it is possible for the simulator or the code generator to decide with the best possible optimization where the functionality will actually be used, or the functionality will actually be called, in the block diagram or in the code to be generated.

In interplay with the above-described function receive block and the above-described function send block, provision is made in the aforementioned computer-implemented method for computer-aided generation of an executable control program for controlling a control system with an electronic computing unit that the function receive block is assigned to the function send block through an assignment component, that the function receive block has a function receive port through which the function receive block is assigned a functionality, and wherein only the interfaces of the assignable functionality are specified in the function receive block in the form of the number of inputs and/or the number of outputs of the functionality, that the function send block has a function send port through which a functionality is sent out to the associated function receive block, wherein the functionality sent out through the function send port is specified in the function send block, and that the function receive block is translated, using the definition of the functionality contained in the function send block, into a representation of the functionality in a high-level programming language, and the defined functionality is implemented in the generated code in this way.

Also relevant to the interplay between function send and receive blocks is whether or not the sent functionality is free of states. In the event that states are present, the question arises of whether the states are provided once for multiple receivers (globally, shared by all receivers) or separately for each receiver. States arise at the block diagram level primarily from blocks that use an internal memory (Unit Delay block, for example) or generally function in a stateful manner, such as state charts, for example. For simulation of the model, and also in the generated code, this is generally represented through separate state vectors that store the states for each receiver. Each receiver then uses his own state vector when he calls the functionality, for example in the generated code by passing a pointer to the state vector or by passing the called function a unique identifier. There are likewise opportunities for optimization in order to intentionally combine states, which is to say to share them between multiple receivers.

The assignment component with which a function send block is assigned to the function receive block can be, for example, a function signal line connected to the function receive port, with this line in turn also being connected to the function send port of the assigned function send block. The described method illustrates once again the interaction of the function send and function receive blocks, making it clear that the system of function receive and function send blocks offers tremendous flexibility, since the functionality itself is not stored in the function receive block, but instead it is only possible to decide based on the specified interfaces of a functionality whether the assignment of a certain functionality through the function receive port is permissible. Nothing need be known at the point of use, which is to say at the location of the function receive block, about the functionality itself, which is to say the function content and thus the algorithm to be used.

In an embodiment of the computer-implemented method, provision is additionally made that the function receive block is translated into a function call using the definition of the interfaces of the assignable functionality in the high-level programming language and the function is translated into the high-level programming language using the definition of the functionality in the function send block. This makes it clear that the function receive block defines the point of use of the assigned functionality, which is to say the location within the function sequence defined by the block diagram where the assigned functionality is called, while the complete definition of the functionality with the algorithmic function content is stored elsewhere, namely in the function send block—either in the function send block itself, or it is referenced there—, so that the assigned functionality can be implemented in every detail through the information contained in the function send block.

In an embodiment, the function receive block can be translated into a pointer to a function using the definition of the interfaces of the assigned functionality in the high-level programming language, and the function itself is translated into the high-level programming language using the definition of the functionality in the function send block. In this variant, the function call thus does not take place in the generated code by means of the customary syntax of the high-level programming language by naming the function call in "plain text," but rather a function pointer is used that points to the starting address of the corresponding function.

In another alternative solution, provision is made that the function receive block can be translated into the high-level programming language inline using the definition of the assigned functionality in the function send block, which is to say without encapsulating the functionality in a function of the high-level programming language. The function itself, which is to say the function content in the form of the algorithm to be implemented, is manifested in its entirety at the point of use defined by the function receive block, so that the assigned functionality is implemented in its full extent here. This has the advantage that (code) runtime overhead for a function call is thus eliminated. As a rule, CPU register values of the calling function should first be saved during sub-function calls and be restored after return from the sub-function (calling conventions). On the other hand, because inlining as described above sacrifices flexibility with regard to later replacement of the functionality without repeated code generation from a modified block diagram, it is advantageous for the user to be able to control this through an option for code generation.

Working with the function send and function receive blocks according to the invention proves advantageous in a very wide variety of situations. It is now possible, for example, to send a functionality to the data that are to be processed, and it is no longer necessary to send the data to be processed to the location of the implemented functionality, which provides considerable advantages, especially in the case of large quantities of data, since it is no longer necessary to transmit these data to the location of the stored functionality at every calculation interval. This saves transmission time in the calculation of the control program as well as additional transmission capacity on the network that connects control units in a distributed system of this type. In contrast to the usually constantly changing data, e.g. received from the input sensors of the overall networked system, at runtime the functionality is usually fixed or changes less often and thus the time, bandwidth and energy used for network transmissions is even further reduced in comparison.

Further scope of applicability of the present invention will become apparent from the detailed description given hereinafter. However, it should be understood that the detailed description and specific examples, while indicating exemplary embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 2A to 2C illustrate exemplary embodiments of a function send block according to the invention;

FIG. 8 illustrates commented pseudocode from the code generator in FIG. 7;

DETAILED DESCRIPTION

Figure 1A:
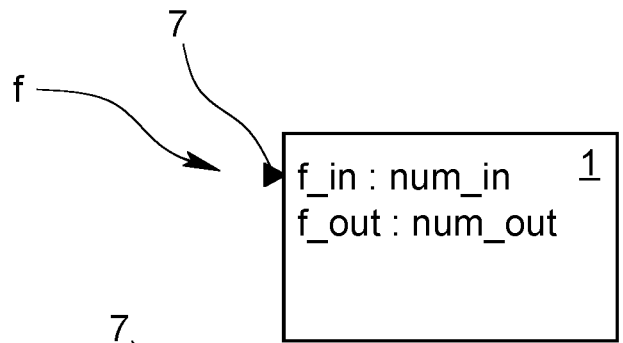
FIG. 1A to 1D illustrate exemplary embodiments of a function receive block according to the invention.

Shown in FIG. 1, first of all, are various embodiments of a function receive block 1 according to the invention. The function receive block 1 shown here is intended basically for use in a graphical, block-based modeling environment 2 for graphical modeling of technical and mathematical relationships with a block diagram 3; the context of such a modeling environment 2 and of such a block diagram 3 is shown in greater detail further below, in FIG. 3. It can also be seen in FIG. 3 that the blocks of the block diagram 3 have input ports 4 and output ports 5, wherein the blocks can be connected through their ports 4, 5 by signal lines 6 for data transmission.

The function receive blocks 1 shown in FIG. 1 have a function receive port 7, through which the function receive block 1 can be assigned a functionality, which here is labeled with a lower case f. In the function receive block 1, only the interfaces of the assignable functionality f are specified in the form of the number of inputs f_in and the number of outputs f_out of the functionality f. In order to distinguish them from the prior art input ports 4 and output ports 5, through which data—including in the form of complex data structures—are received and transmitted, the function receive ports 7 are shown as filled-in symbols. Conventional input ports 4 and output ports 5 on the one hand and the function receive ports 7 on the other hand are represented differently here only to make it easier to distinguish them; an outward graphical distinction need not necessarily be made in an actual implementation within a modeling environment 2.

In FIG. 1*a*, the number of inputs f_in is specified with "num_in" and the number of outputs f_out of the functionality f is specified with "num_out". This is put in concrete terms in FIG. 1*b*, where the number of inputs f_in is specified as 2, and the number of outputs f_out is specified as 1.

Figure 1B:
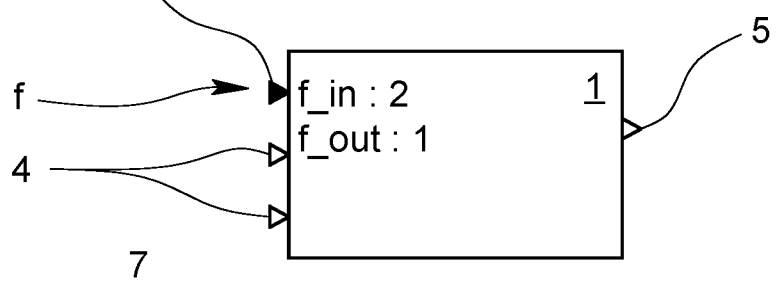
Figure 1C:
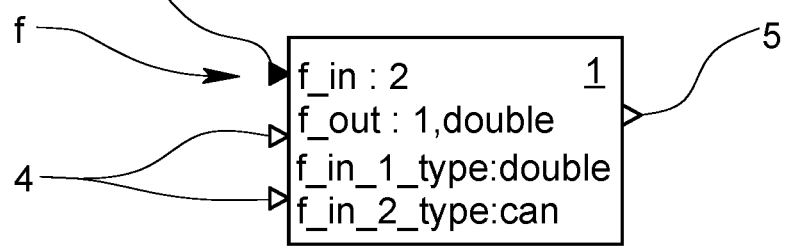

The function receive blocks in FIG. 1*b* to 1*c* are further distinguished by the fact that they have a number of input ports 4 and output ports 5 corresponding to the definition of the interfaces of the assignable functionality f, wherein the function receive blocks 1 shown were automatically equipped with a corresponding number of input ports 4 and output ports 5 after definition of the interfaces of the assignable functionality f had taken place. This has the advantage that it is immediately evident how many inputs the assignable functionality f uses and how many outputs it generates. It is only logical that the inputs and outputs of the assignable functionality are made available via a block diagram, which is to say with input ports 4 and output ports 5, even though other transfer mechanisms would easily be possible.

FIG. 1*c* shows that the definition of the interfaces of the assignable functionality f also includes the type of the inputs and outputs, here in the form of the data types of the two inputs and one output. The data type of the first input f_in_1_type is specified as "double" and the data type of the second input f_in_2_type is specified as "can", which is to say it is a data structure in the form of the message of a CAN bus protocol. The data type of the output f_out_1_type is specified as "double".

Figure 1D:
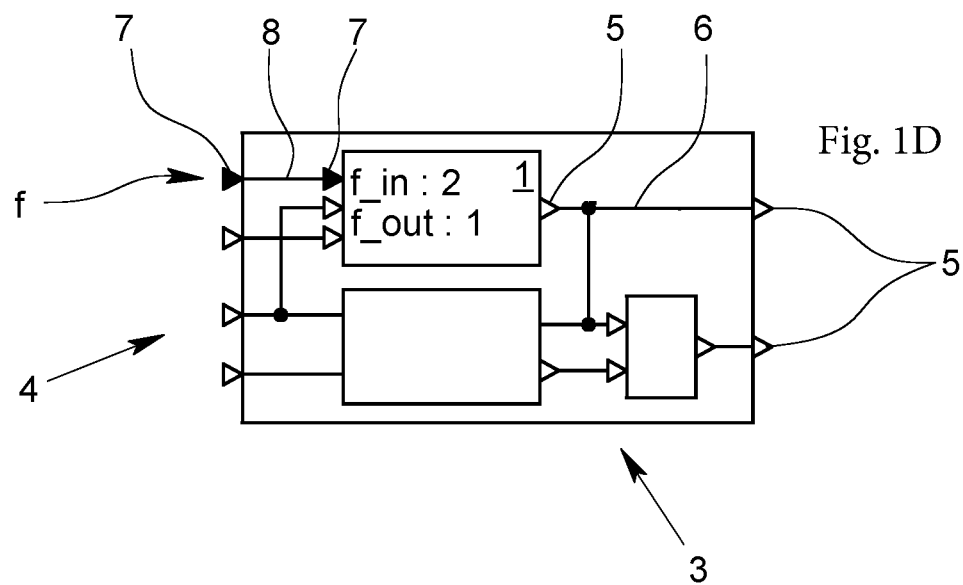

FIG. 1*d* shows that function receive blocks 1 can also be blocks within a hierarchically higher-level block. The higher-level block here likewise contains a function receive port for feeding in the assignable functionality f, while the exemplary embodiment also shows how a function receive block 1 can be incorporated into a block diagram 3. At the same time, FIG. 1*d* also illustrates that the assignable functionality f is received through a function signal line 8 connected to the function receive port 7. The first of the two function receive ports 7 has a forwarding nature here; in this way the established means of the modeling environment—that are already present for data signals—remain usable.

The examples as a whole make it clear that the concept presented of function receive blocks with their function receive ports makes it possible to work with functional signals in the same way as has previously been possible with conventional data (or data signals resp.). It is easily possible to transfer the tools of modeling available for data (e.g., summation, multiplication, routing blocks) to the management of received functionalities as well.

FIG. 2 shows the functional counterpart of the function receive block 1, namely various embodiments of a function send block 9, wherein the function send blocks 9 are likewise provided for the graphical, block-based modeling environment 2 for graphical modeling of technical and mathematical relationships with a block diagram 3, wherein the blocks of the block diagram 3 have input ports 4 and output ports 5, and wherein the blocks can be connected through their ports 4, 5 by signal lines for data transmission. The function send blocks 9 shown each have a function send port 10, through which a functionality, here labeled f, is sent out, wherein the functionality f that is sent through the function send port 10 is also defined in the function send block 9. This is illustrated in FIG. 2*a* by the notation "definition(f)". Definition of the sent functionality f in the function send block 9 can be undertaken in a wide variety of ways. In FIG. 2*b*, the definition of the sent functionality f comprises the name of the functionality, the interfaces of the functionality f, and the functionality itself, which is illustrated by the implied function definition f( ... ). In contrast, the definition of the function f to be sent is stored in the function send block 9 by a reference as shown in FIG. 2*c*, i.e., the definition of the sent functionality f includes a reference to a functionality stored outside of the function send block 9, which is indicated here by the notation "reference(f)". The name of the functionality, the interfaces of the functionality, and the functionality itself are retrievable through the reference, with the functionality f in the present case being included in a function library 11, which is labeled "fcn_bib" in FIG. 2*c*).

Shown in each of FIGS. 3 to 6 is a computer-implemented method 12 for computer-aided generation of an executable control program 13 for controlling a control system 14 with an electronic computing unit 15. Oftentimes the control system 14 is a control unit with one or more microcontrollers as the electronic computing unit 15, wherein this control system 14 interacts through a process interface 16 with a physical process 17, namely acquires measured variables from the physical technical process 17, and acts on the physical technical process 17 through the interface 16 by the output of control variables. The computer-implemented method 12 thus directly influences the physical technical process 17.

Figure 3:
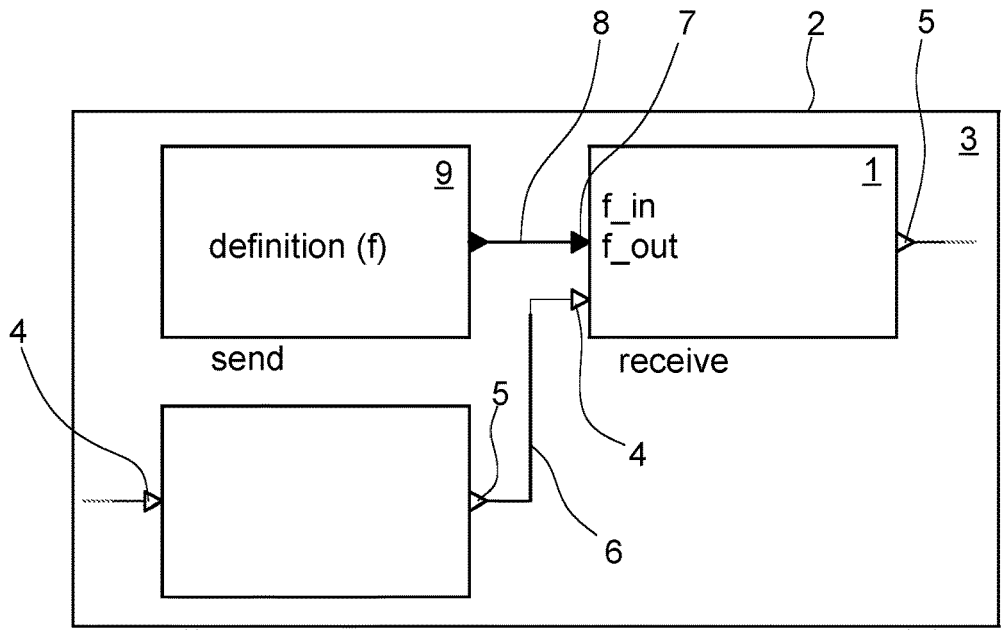
FIG. 3 is a schematic representation of the computer-implemented method according to the invention for computer-aided generation of an executable control program using the aforementioned function receive and function send blocks.
Figure 3:
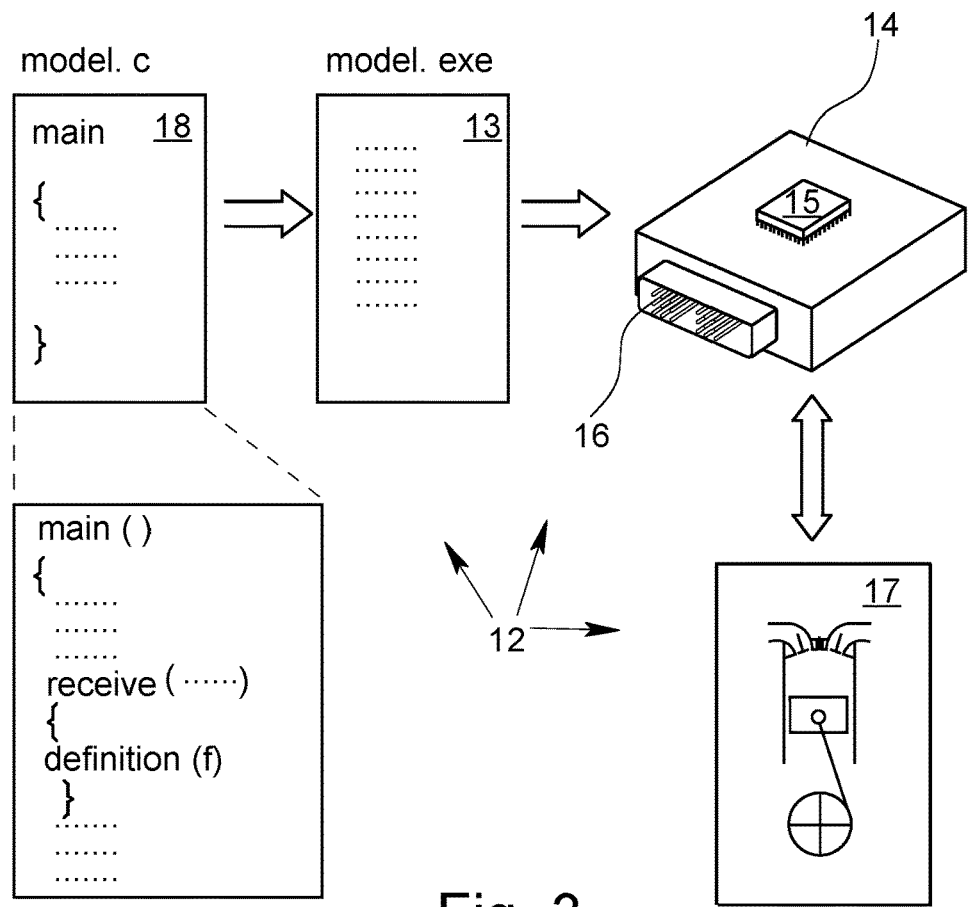

It is additionally indicated in FIG. 3 that the graphical model 3 or the block diagram 3—they are equivalent here—is first translated into a high-level programming language, with the code 18 resulting from the graphical model 3 being labeled "model.c" here.

It is important in the depiction in FIG. 3 that the graphical model 3 has at least one of the previously described function receive blocks 1 and at least one of the previously described function send blocks 9. The function receive block 1 is assigned to the function send block 9 through an assignment component 8, wherein the function receive block 1 has a function receive port 7 through which the function receive block 1 is assigned a functionality, which is labeled f in the drawing, and wherein only the interfaces of the assigned functionality are specified in the function receive block 1 in the form of the number of inputs f_in and the number of outputs f_out of the functionality f. The function send block 9 has a function send port 10 through which a functionality—also labeled f here—is sent to the associated function receive block 1, wherein the functionality f sent through the function send port 10 is specified in the function send block 9, identified here by "definition(f)". The function receive block 1 is translated into a representation of the functionality in a high-level programming language using the definition of the functionality f contained in the function send block 9, and the defined functionality f is implemented in the generated code in this way, as indicated in FIG. 3 at the bottom left. Here, the function "receive( . . . )", which contains the definition "definition(f)" of the functionality f, is generated for the function receive block 1, which is captioned underneath with "receive".

Figure 4:
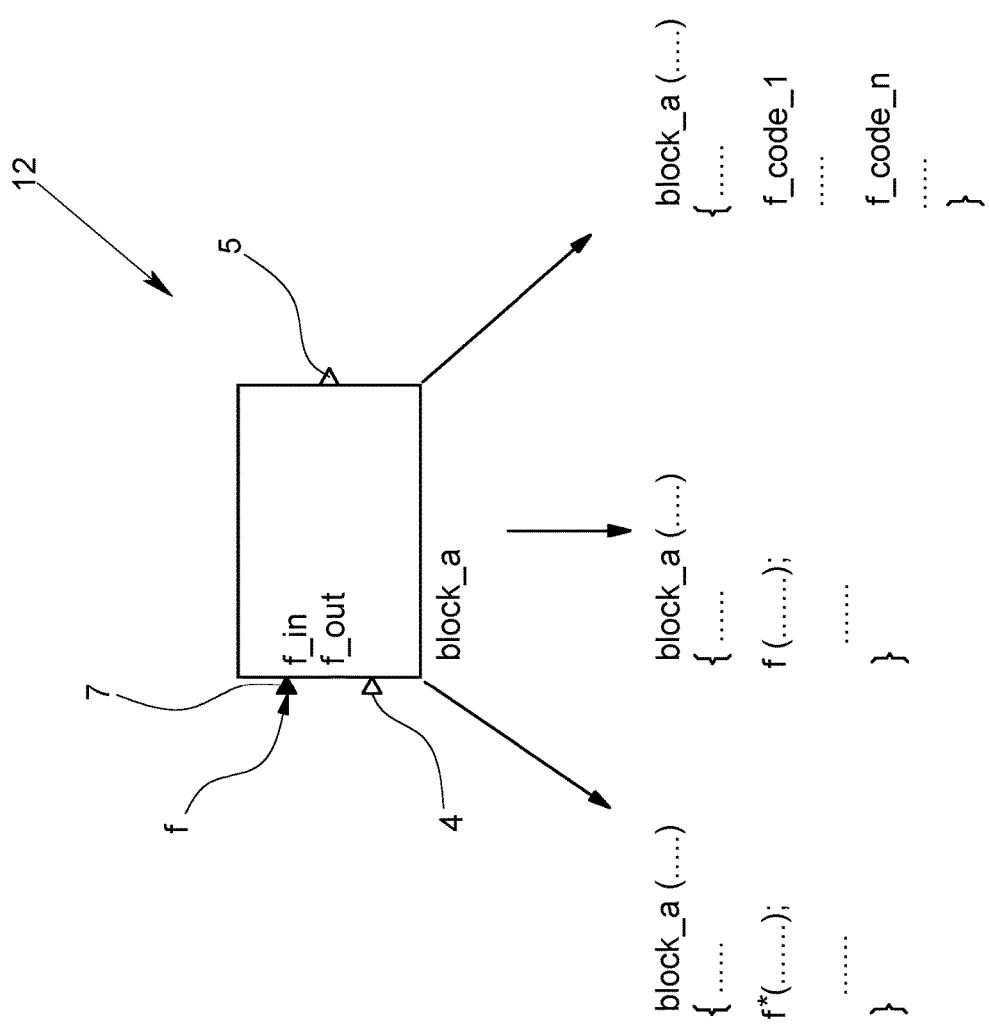
FIG. 4 illustrates various possibilities for code generation and implementation of a function f within the framework of a function receive block.

FIG. 4 shows how the assigned functionality f can be translated into the high-level programming language. Three different code implementations are shown in a very rudimentary manner below the function receive block 1, which is also labeled here as "block_a". The center variant is distinguished in that the function receive block is translated into a function call f( . . . ) using the definition of the interfaces of the assignable functionality f in the high-level programming language, and the function itself is translated into the high-level programming language using the definition of the functionality f in the function send block, which is not explicitly shown here.

Shown on the left in FIG. 4 is another variant, which is distinguished in that the final function call in the high-level programming language is not defined by name, but instead takes place indirectly through a function pointer as a proxy. This has the advantage that the target of the pointer can be changed after the fact without changing the code of the caller itself, for example if a different function send block is connected to the receive block in an integration model. In the generated code, this assignment can then take place through initialization of the pointer with the address of the target function (belonging to the send block). A larger example of this can be seen in FIG. 7 and the associated pseudocode in FIG. 8.

In the implementation variant shown to the right of this in FIG. 4, provision is made that the function receive block 1 is translated into the high-level programming language inline using the definition of the assigned functionality in the function send block—not shown—which is to say without encapsulating the functionality f in a function of the high-level programming language, which is indicated in FIG. 4 by the code lines "f_code_1" and "f_code_n".

Figure 5:
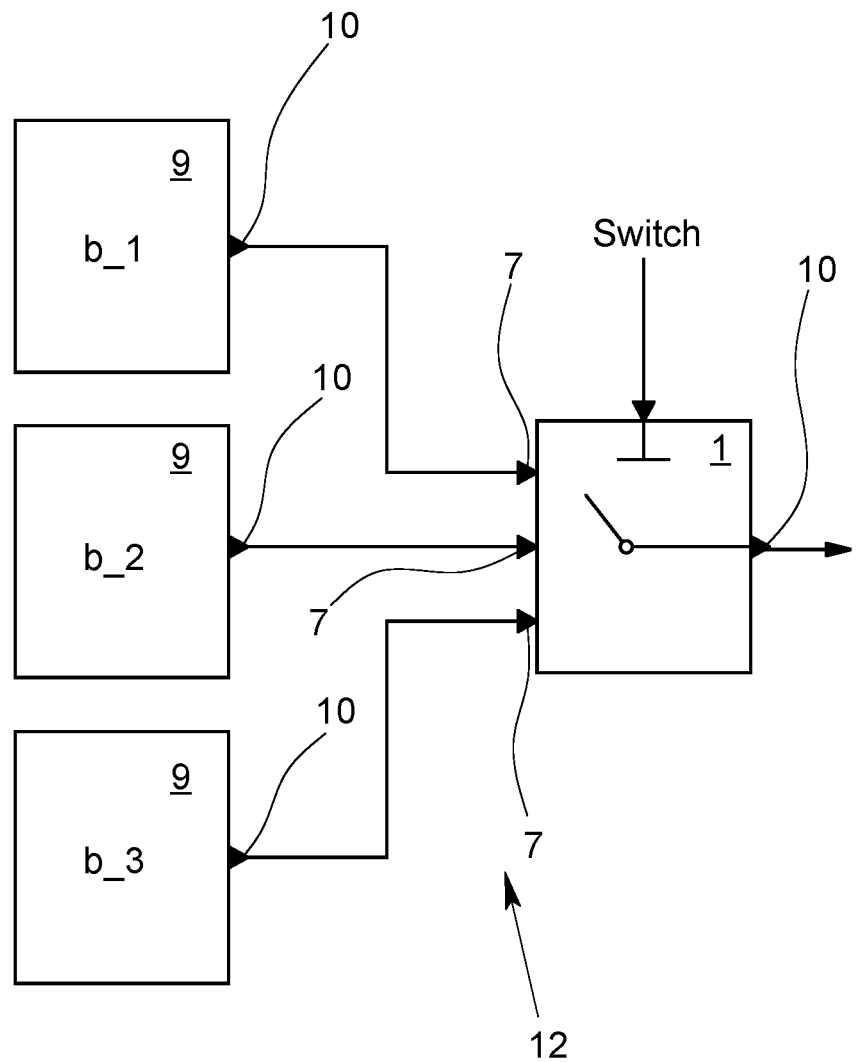
FIG. 5 illustrates the interaction between function receive block and function send block with the possibility of forwarding an assignable functionality.

FIG. 5 shows that function receive blocks 1 do not necessarily have to themselves execute the functionality assigned to them through a function receive port 7, but instead can send this functionality onward through a function send port 10. In the exemplary embodiment shown, there are three function send blocks 9, which have variants of a functionality b, namely the functionality variants b_1, b_2, and b_3. By means of the function receive block 1, which is designed in the manner of a multiplexer—the active function receive port 7 is selected by the signal line "switch"—one of the variants of the assigned functionality b is chosen (dynamically at runtime or statically at simulation start or code generation start) and then sent onward with the function send port 10; in other words, the function receive block 1 here is not itself the point of execution of the functionality b sent by the function send blocks 9, but rather another subsequent receiving block in the model.

Figure 6:
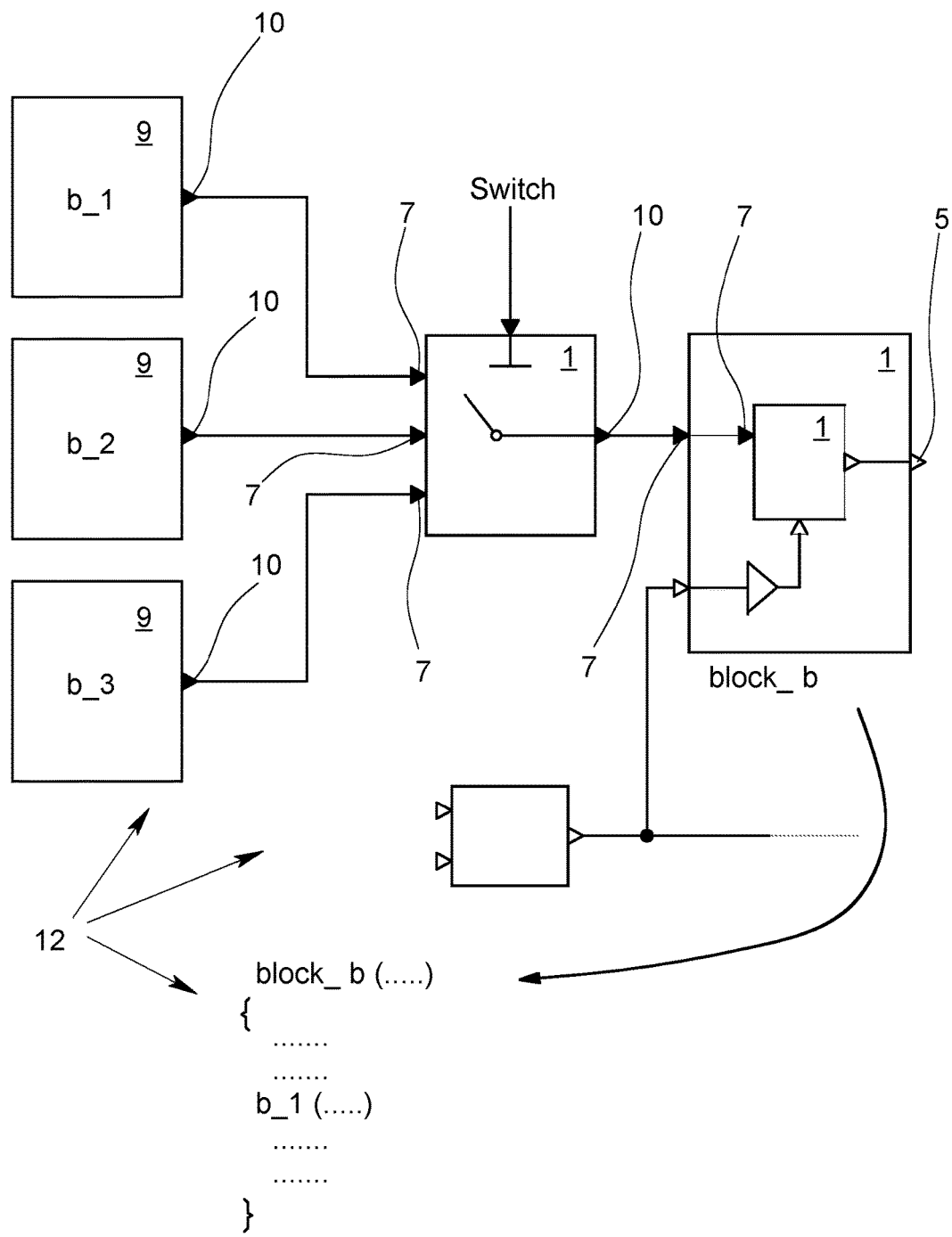
FIG. 6 is an expanded exemplary embodiment based on FIG. 5.

FIG. 6 is an expansion of the representation from FIG. 5. Connected to the function receive block 1 in the manner of a multiplexer here is an additional function receive block 1, which is labeled as a whole as "block_b". This block merely emits a data signal through the output port 5 so that the currently selected functionality b_1 should be executed in the block "block_b"; thus, in the present case the function "block_b( . . . ) generated for the block "block_b" contains a function call for the functionality b_1. In an enhancement of the method, an analysis is made as to whether the function receive block 1 being used in each case merely drives the function receive port 17 of another function receive block 1, where in this case the functionality for the function receive block 1 is not translated into a high-level programming language at this point or code location, but instead the complete functionality of the function receive block 1 is transferred to the other function receive block 1. Thus, if the block "block_b" had no output port 5 for normal data, but instead had a function send port 10, then accordingly no functional call of the functionality b_1 would be generated in the code location for the block "block_b"; instead, this functionality would be sent onward together with the functionality otherwise contained in the block "block_b" through the assumed function send port to another connected function receive block—not shown here—and would only be code-generated for use at this location.

Figure 7:
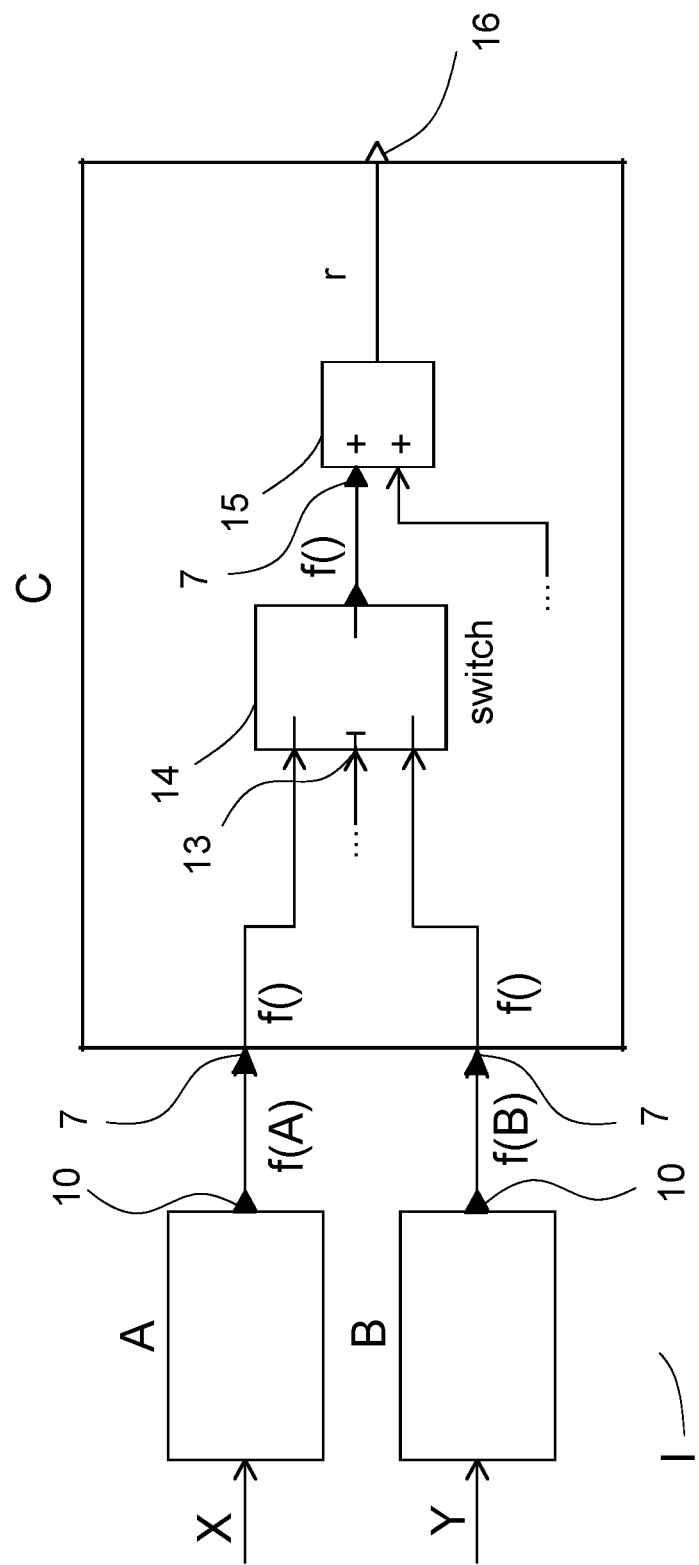
FIG. 7 is an exemplary embodiment concerning forwarding and speed-optimized calculation with functional signals and separated code generation units.

FIG. 7 shows that this method can be used in further generalized form in conjunction with conventional blocks, ports, and lines. In the diagram, three sub-models A, B, and C are shown integrated into one integrated model I. For A, B, C, code should be generated, or has already been generated (from the viewpoint of code generation for I), in individual, separate modules in each case (as code generation units) for the purpose of reuse, reduction into smaller units, or similar reasons. The inports of C were designed as function receive ports 7, so that functional signals f( ) are used at this point in C and the output signal lines of A and B can also be functionally viewed as (f(A)) and (f(B)). The specification of the port 1 takes precedence and passes these properties on to the connecting lines in the directions of A and B. It should be noted that no change to A or B or to their generated code modules is required for this purpose.

Thereafter, in C, the signal selected in each case by the select input 13, the wiring of which is not shown in detail here, is both inherited through the conventional switch block 14 and continued as a functional signal f( ). Not until it is necessary to calculate the summation result of the addition block 15 that receives through a function receive port 7 for the output 16 of C is it necessary to execute the functionality of one of A or B so that the result thereof, specified by the applicable function send port 10 and calculated using the then-present input signal values X and Y, can be used for addition. Evaluation of A and/or B is not strictly necessary before this point and only the selected one of A or B needs to be calculated at all, not both. The sub-models A and B are assumed to be stateless here; states are to be viewed as side effects in the model or code: if A and B were stateful, different semantics where both A and B are always calculated would be desirable. This is because a later execution of A or B depends on the prior calls of A and B, so consequently it might be erroneous to omit them at a time step of the control program. Having the full picture from integration model I the code generator would then likely give an error message if previously generated code for C was already optimized for stateless functions when stateful A or B are connected in I. Another way to cope with the situation would be to generate and then configure by I one or more additional function parameters for function C that specifies statelessness or not at runtime or compilation time for C, selecting another code path inside of C( ) executing both A( ) and B( ).

The type of optimization described above is customary at the block diagram level, and is used during code generation of a model in a code generation unit. But here, by contrast, in the example shown in separated code, this optimization is first made possible by the creation of the functional signals through the function receive ports 7, since it is only by this means that the separate code from C can "delay" the call of a functionality beyond module boundaries, which is to say to not place it until the time of the addition and after the selection by the switch block 14. As a result, only either A or B is calculated at the time of, or at the position in the code of, the addition, which saves run time, and thus allows, e.g., faster control or else the use of a smaller, more economical hardware unit for the control system.

The generated code function of C would thus, e.g., receive two function pointers or contain global pointer variables. The code generator would then not populate them with the addresses and inputs of the functions A and B until the code generation of the function 10 for the module of the integrated model I (for the control system), just as their functionalities in the model are sent from I through the connecting lines therein to C. In particular, the separated code from C remains untouched, which is to say independent of the specific A or B. Pseudocode structured in this way, with the relevant excerpts from the modules for C and I, is shown and commented in FIG. 8. A check that A and B match the expected input of C could likewise be established from the interconnection in I and during its code generation. Any discrepancies during interconnection of the resultant functional signals could then be output as an error message for the user by the modeling environment or the code generator, as is customary.

Taking a look at the block diagram shown in FIG. 7, it is evident that, aside from the said settings for the function receive ports 7 from C, only conventional components and stylistic elements of the modeling environment have been used. Because it is customary to specify code implementation settings for the code generation in the diagrams in addition to the purely algorithmic fundamentals of the block diagram (on-top), the solution could also be implemented purely at the level of code generation from the model. The block diagram remains unchanged in the modeling environment, particularly with regard to sequence and calculation in the model-based simulation.

Figure 9:
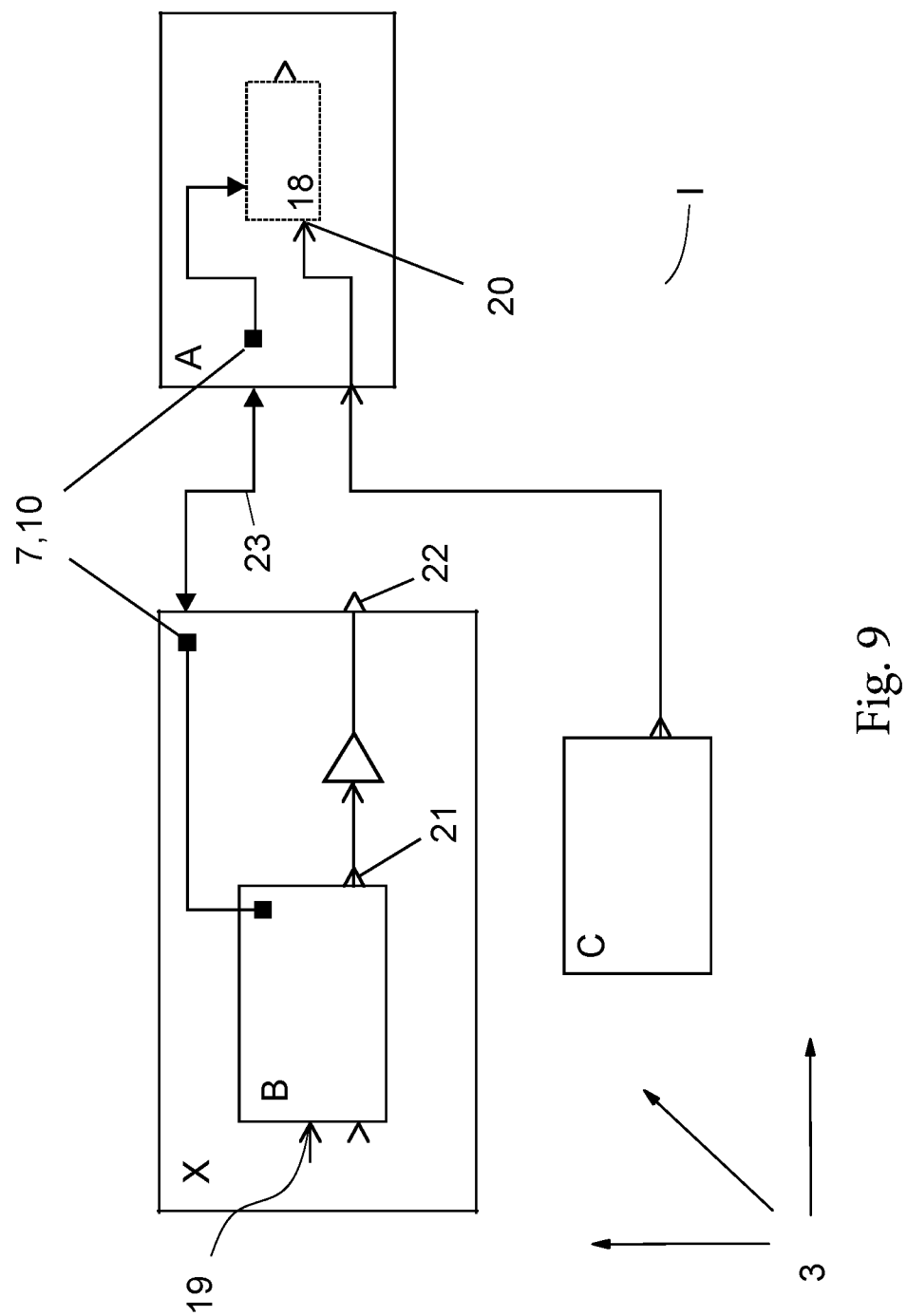
FIG. 9 is an exemplary embodiment concerning the use of function send and receive ports in a bidirectional manner.

FIG. 9 shows how function send and receive ports according to the present invention can also be used in a bidirectional manner. In the block diagram 3, shown schematically with integration model I, the sub-models X and A communicate through functional receive and send ports 7, 10 (shown as squares here), and A contains a receiver as placeholder 17, which accepts the received functionality B (shown in dashed lines in the diagram). B receives its input partially from X through the connected data port 19 and from A through the second port 20, which is fed from another sub-model C. The output port 21 for the result of B is in turn connected in X and not in A. This means that even though B is calculated in A (at the location of A) with the input data from X and A (supplied by another sub-model C, for example), the result is in turn forwarded to X through 21, where it is further processed and the final result thereof is then output through port 22. The further connection of port 22 in I is omitted here for reasons of clarity, and is not relevant to the topic, since it is a conventional data port. For this reason, the functional connection is shown in this example as a bidirectional signal line 23 because an exchange of functionality and associated data takes place in both directions.

In code generated for this integrated model, X and A would be converted into code in a high-level programming language such that A receives the functionality B and the return port when called from X. This can be achieved thusly via modern, high-level programming languages. Here is example pseudocode for this:

Int X(void)
{
Int port;
A(B, &port);
return port*2;
}

In the example from FIG. 9, the input data came partially from X and partially from A, and output was accepted again in X. Of course, other cases are also possible for how inputs and outputs are distributed differently between the two sides of sender and receiver.

If the physical control system for executing the control program thus generated has multiple control units in a network, then it is also possible to implement a type of remote task execution through this type of modeling and then appropriate code generation. In this case, the sent functionality would in fact be transmitted over the network and then be calculated locally at the receiving control unit using its hardware resources (which is to say CPU, RAM, I/O sensors, and their current values). Results can be sent back through the network to the sending control unit in exactly the same manner to be further processed there. As already mentioned above, the functionality need not be transmitted again at each calculation step but instead this could also take place just once when starting the overall system in order to save transmission capacity in the network.

Figure 10:
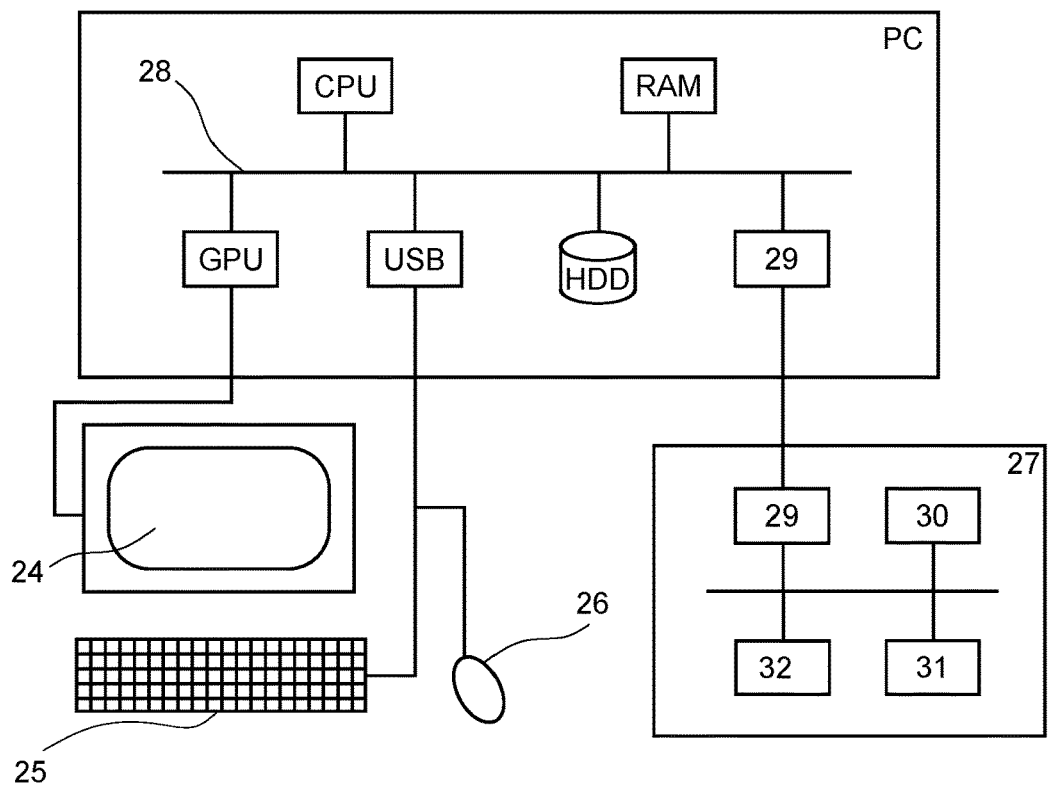
FIG. 10 is an exemplary diagram of a computer system.

FIG. 10 illustrates an exemplary embodiment of a computer system.

The shown embodiment comprises a host computer PC with a display 24 and human interface devices such as a keyboard 25 and a mouse 26; further, an embedded system 27 is depicted, which may e.g. be used for a processor-in-the-loop simulation.

The host computer PC comprises at least one processor CPU with one or multiple cores, a random access memory RAM and a number of devices connected to a local bus 28 (such as PCI Express), which exchanges data with the CPU via a bus controller (not shown). The devices comprise e.g. a graphics-processing unit GPU for driving the display, a controller USB for attaching peripherals, a non-volatile memory HDD such as a hard disk or a solid-state disk, and a network interface 29. Preferably, the nonvolatile memory comprises instructions that, when executed by one or more cores of the processor CPU, cause the computer system to carry out a method according to one of the claims.

The embedded system 27 comprises a network interface 29, an actuator interface 30 and a sensor interface 31 as well as a microcontroller 32. As an alternative or addition to the microcontroller 32, the embedded system 27 may comprise a programmable logic device such as a field-programmable gate array. The programmable logic device may contain a hardwired digital signal processor and it may be configured to comprise an IP core microprocessor. Preferably, the embedded system 27 is connected to the personal computer PC via the network interface 29, which may e.g. be of USB, RS-232 or Ethernet type. The embedded system may comprise a non-volatile memory that comprises instructions to be carried out by the microcontroller or a configuration to be loaded on the programmable logic device.

Figure 11:
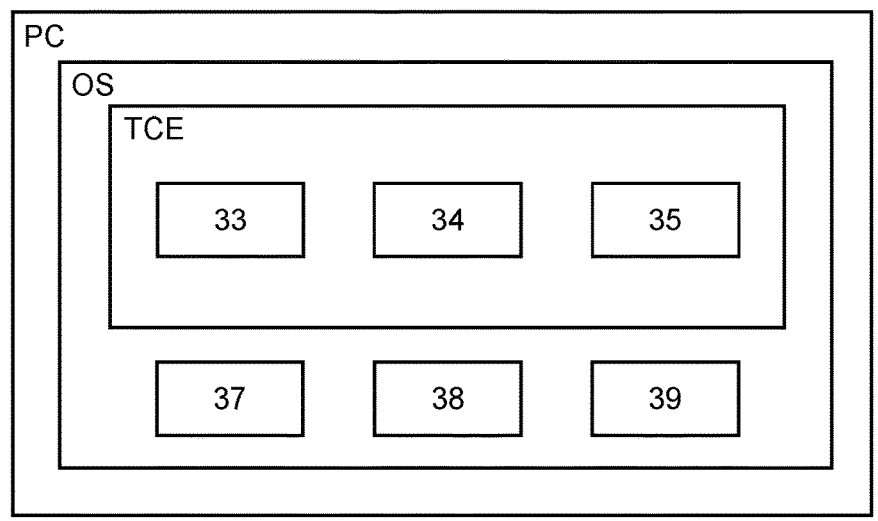
FIG. 11 is an exemplary diagram of software components in a computer system.

FIG. 11 displays an exemplary embodiment of the software components being executed on a computer system, which may be realized as a host computer PC with a standard microprocessor that runs a standard operating system OS such as Microsoft Windows or a Linux distribution.

On the host computer PC, a technical computing environment TCE such as Matlab/Simulink of TheMathworks may be installed. Other examples of technical computing environments comprise Labiew of National Instruments or ASCET of ETAS.

The technical computing environment TCE comprises a plurality of software components such as a modelling environment 33 and a simulation engine 34. Additionally, the TCE may comprise a mathematical and/or script interpreter 35 that is adapted for carrying out calculations or modifying data. The TCE comprises a production code generator 36 that is adapted to produce production code from a model. The expression that a software component is comprised in the TCE is intended to encompass the case that the software component uses a specific mechanism of the TCE such as an application programming interface of the TCE in order to exchange data and/or instructions with other software components in the TCE. For example, a software component may be realized as or comprise an add-on such as a toolbox for the modelling environment.

The modelling environment 33 may provide a graphical user interface for creating and modifying block diagrams that preferably describe the temporal behavior of a dynamic system. Additionally, blocks adapted for describing finite states and conditions for transitions between states may be used to model the dynamic system. A block may describe an atomic operation, such as an arithmetic calculation or a logic expression, or it may represent a subsystem that is described in more detail by an additional block diagram in a subordinate hierarchical level. Alternatively, it may contain code in a higher-level programming language, in particular, a dynamic language intended for mathematical programming, that realizes the block's functionality. Multiple blocks may be connected by signals for the exchange of data. For example, an initial block may receive a signal of type single as input signal, may modify the signal e.g. by adding a constant and may send an output signal of type double to a further block. The further block may be downstream of the initial block because a signal path connects them so that data flows from the initial block to the further block.

The simulation engine 34 may be adapted to execute a block diagram created in the modelling environment 33 in order to observe the temporal behavior of the dynamic system described by the block diagram. The execution of a block diagram may also be called a model-in-the-loop simulation of the dynamic system and is preferably carried out using high-precision operations in order to observe the behavior more closely and to create reference data.

The production code generator 36 allows for creating production code from one or more blocks in a block diagram. Production code may be optimized for readability, traceability, safety, low-energy consumption, and execution speed and/or memory requirements. For example, the code generator can provide a user interface for setting a plurality of options for adapting the customization of the generated code. Customization options may include target-specific optimizations for the microcontroller of the embedded system and enforcing compliance of the generated code to a specific standard, such as the MISRA C guidelines. A production code generator can be, for example, Targetlink of dSPACE.

Other software components such as a production code compiler 37, a debugger 38 or a comparison tool 39 may also be installed on the computer. These software components may be interfaced to each other and/or the technical computing environment using standard mechanisms of the underlying operating system OS. The compiler 37 may generate an executable for the microprocessor of the PC or it may generate an object code for the microcontroller of the embedded system. Additionally, it may be configured to generate additional debugging information and to include it in the executable. In this way, the debugger 38 can e.g. be used for observing the value of a signal during a software-in-the-loop simulation of the generated production code. Depending on the intended use, the observed values may be directly displayed to the user and/or they may be logged in a memory, e.g. in RAM, in a file or a database.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A function receive block for a graphical, block-based modeling environment for graphical modeling of technical and mathematical relationships, the function receive block comprising:
a block diagram, wherein blocks of the block diagram have input ports and/or output ports, wherein the blocks are connectable through the input ports and/or output ports by signal lines for data transmission; and
a function receive port through which the function receive block is assigned a functionality, wherein only interfaces of the functionality are specified in the function receive block in a form of a number of inputs and/or a number of outputs of the functionality,
wherein the bock diagram is configured to be executed by a simulation engine to perform a simulation on an electrical computing unit based on the functionality.

2. The function receive block according to claim 1, wherein a definition of the interfaces of the functionality also includes a type of the inputs and/or of the outputs, or data types of the input variables and/or of output variables.

3. The function receive block according to claim 1, wherein the function receive block has a number of input ports and/or output ports corresponding to a definition of the interfaces of the functionality, or is automatically equipped with a corresponding number of input ports and/or output ports after definition of the interfaces of the assignable functionality has taken place.

4. The function receive block according to claim 1, wherein, with the aid of a definition of the interfaces of the assignable functionality for the function receive block, generation of code takes place of a corresponding function call that reflects the definition of the interfaces.

5. The function receive block according to claim 1, wherein the functionality assigned through the function receive port is executed by the function receive block itself, or is code-generated for the function receive block itself, so that the functionality is called and executed at its position in code.

6. The function receive block according to claim 1, wherein the functionality assigned through the function receive port is sent out from the function receive block through a function send port.

7. The function receive block according to claim 6, wherein the functionality sent out from the function receive block through the function send port is concatenated with a functionality implemented in a fixed manner in the function receive block, and
  wherein a complete functionality of the function receive block is sent.

8. A function send block for a graphical, block-based modeling environment for graphical modeling of technical and mathematical relationships, the function send block comprising:
  a block diagram, wherein blocks of the block diagram have input ports and/or output ports, wherein the blocks are connectable through the input ports and/or output ports by signal lines for data transmission; and
  a function send port through which a functionality is sent out, wherein the functionality sent out through the function send port is defined in the function send block,
  wherein the bock diagram is configured to be executed by a simulation engine to perform a simulation on an electrical computing unit based on the functionality.

9. The function send block according to claim 8, wherein a definition of a sent functionality includes a name of the functionality, interfaces of the functionality, at least one argument of the functionality, and/or the functionality itself.

10. The function send block according to claim 8, wherein a definition of a sent functionality includes a reference to a functionality stored outside of the function send block,
  wherein a name of the functionality, interfaces of the functionality, and the functionality itself are retrievable through the reference, or
  wherein the functionality is contained in a function library.

11. A computer-implemented method for computer-aided generation of an executable control program for controlling a control system with the electronic computing unit, wherein a functionality of the control program is at least partially described in the graphical, block-based model, and the graphical, block-based model includes at least one function receive block according to claim 1 and a function send block,
  wherein only the interfaces of the functionality are specified in the function receive block in the form of the number of inputs and/or the number of outputs of the functionality,
  wherein the function send block has a function send port through which the functionality is sent out to an associated function receive block,
  wherein the functionality sent out through the function send port is defined in the function send block, and
  wherein the function receive block is translated, using a definition of the functionality contained in the function send block, into a representation of the functionality in a high-level programming language, and a defined functionality is implemented in the generated code.

12. The computer-implemented method according to claim 11, wherein the function receive block is translated into a function call using a definition of the interfaces of the functionality in the high-level programming language, and
  wherein the functionality itself is translated into the high-level programming language using the definition of the functionality contained in the function send block.

13. The computer-implemented method according to claim 11, wherein the function receive block is translated into a pointer to a function using a definition of the interfaces of the functionality in the high-level programming language, and
  wherein the functionality itself is translated into the high-level programming language using the definition of the functionality contained in the function send block.

14. The computer-implemented method according to claim 11, wherein the function receive block is translated into the high-level programming language inline using a definition of the functionality in the function send block, without encapsulating the functionality in a function of the high-level programming language.

15. The computer-implemented method according to claim 14, wherein an inline translation of the function receive block is selectively activated through an option of a code generator.

16. The computer-implemented method according to claim 11, wherein an analysis is made as to whether the function receive block drives the function receive port of another function receive block,
  wherein, when the function receive block drives the function receive port of said another function receive block:
    the functionality for the function receive block is not translated into the high-level programming language, and
    a complete functionality of the function receive block is transferred to said another function receive block so that the complete functionality of the function receive block is translated into the high-level programming language together with a complete functionality of said another function receive block.

17. The computer-implemented method according to claim 11, wherein an analysis is made as to whether the function receive block drives the function receive port of another function receive block,
  wherein, when the function receive block drives the function receive port of said another function receive block:
    the functionality for the function receive block is not translated into the high-level programming language together therewith at its position in the generated code, and
    wherein the complete functionality of the function receive block is transferred to said another function receive block, so that a complete functionality of the function receive block, together with the functionality of said another function receive block is translated into the high-level programming language at its position in the generated code together therewith.

18. A system comprising:
  an electronic computing unit; and
  a graphical, block-based modeling environment comprising:

a function send block comprising:
a plurality of send blocks having input ports and output ports, the plurality of send blocks being connectable through the input ports and the output ports of the plurality of send blocks; and
   a function send port configured to send out a functionality, the functionality sent out through the function send port being defined in the function send block; and
a function receive block comprising:
   a plurality of receive blocks having input ports and output ports, the plurality of receive blocks being connectable through the input ports and the output ports of the plurality of receive blocks;
   a function receive port configured to receive the functionality, the functionality being assigned to the function receive block; and
   an interface of an assignable functionality specified in the function receive block in a form of a number of inputs or a number of outputs of the functionality.

* * * * *